United States Patent
Ruf et al.

(10) Patent No.: US 6,903,009 B2
(45) Date of Patent: Jun. 7, 2005

(54) METHODS FOR FABRICATING A CONTACT FOR AN INTEGRATED CIRCUIT

(75) Inventors: Alexander Ruf, Dresden (DE); Manfred Schneegans, Vaterstetten (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/364,070

(22) Filed: Feb. 11, 2003

(65) Prior Publication Data

US 2003/0173589 A1 Sep. 18, 2003

(30) Foreign Application Priority Data

Feb. 28, 2002 (DE) .......................................... 102 08 714

(51) Int. Cl.[7] .......................................... H01L 21/4763
(52) U.S. Cl. ........................ 438/637; 438/672; 438/673
(58) Field of Search .......................... 438/672, 673–675, 438/637–639

(56) References Cited

U.S. PATENT DOCUMENTS

| | | | |
|---|---|---|---|
| 5,312,774 A | | 5/1994 | Nakamura et al. |
| 5,472,912 A | * | 12/1995 | Miller .......................... 438/643 |
| 6,277,729 B1 | * | 8/2001 | Wu et al. ..................... 438/627 |
| 2001/0002334 A1 | * | 5/2001 | Lee et al. .................... 438/652 |
| 2002/0135071 A1 | * | 9/2002 | Kang et al. .................. 257/767 |
| 2002/0155219 A1 | * | 10/2002 | Wang et al. .......... 427/255.391 |
| 2003/0124842 A1 | * | 7/2003 | Hytros et al. ................ 438/680 |

FOREIGN PATENT DOCUMENTS

| | | |
|---|---|---|
| DE | 19645033 A1 | 5/1997 |
| DE | 19826031 A1 | 12/1998 |
| JP | 04370955 A | 12/1992 |
| JP | 06349774 A | 12/1994 |
| JP | 10012725 A | 1/1998 |

* cited by examiner

Primary Examiner—Dung A. Le
(74) Attorney, Agent, or Firm—Jenkins, Wilson & Taylor, P.A.

(57) ABSTRACT

According to one embodiment, a method for fabricating a contact is provided. The method can include a step of depositing a Ti layer in order to completely fill a contact hole and on a surrounding surface of an insulation layer. The method can also include a step of partially converting the Ti layer into a TiN layer in such a manner that a TiN layer is provided on the top side in the contact hole. Further, the method can include a step of polishing back the Ti layer and any remaining TiN layer on the surrounding surface of the insulation layer in a single-stage polishing step.

2 Claims, 3 Drawing Sheets

METHODS FOR FABRICATING A CONTACT FOR AN INTEGRATED CIRCUIT

TECHNICAL FIELD

The present invention relates to a contact for an integrated circuit, and to a corresponding fabrication method.

BACKGROUND ART

Although they can in principle be applied to any desired integrated circuits, the present invention and the problem on which it is based are explained with reference to integrated circuits produced using silicon technology.

Metallizations in contact holes of semiconductor circuits for connecting metal planes or metal and semiconductor planes which lie above one another, for example in DRAM and logic circuits, contain multiple metal layers comprising low-resistance bonding and diffusion barrier layers and fillings comprising nucleation and bulk layers.

PVD (Physical Vapor Deposition) processes and MCVD (Metal Chemical Vapor Deposition) processes are used to produce layers of this type.

A typical 4-layer system for a contact-hole metallization is:

Ti(PVD)+TiN(PVD)+W nucleation (MCVD)+W bulk (MCVD)

The need to match the individual layers to one another and the use of different deposition processes result in complex development work and disruption to the production sequences caused by deviations in the individual layer uniformity and increased levels of defects.

For smaller structures with higher aspect ratios (quotient of height and diameter), complete filling can no longer be achieved. In this case, unfilled voids remain in the center of the contacts and act as a contamination source for example for a following metal plane. Further reductions in the minimum feature size in microelectronics mean that the absolute diameter of contact holes both on the silicon substrate and between the metal planes is being constantly reduced further, while at the same time the aspect ratio is rising.

For future technology generations, the present invention will provide a reliable contact between a metal plane and silicon or between different metal planes and, with simultaneous simplification of the process flow, will make it possible to considerably reduce the process costs.

Hitherto, to ensure a reliable contact, for example on a silicon substrate, first of all a liner layer of titanium or titanium nitride has been deposited. This liner layer is then heat-treated in a forming-gas atmosphere at approx. 600° C. This step leads to one-off conversion of some or all of the titanium into titanium silicide in order to reduce the contact resistance. Furthermore, the formation of TiN or the increase in the thickness of the titanium nitride which is already present improves the barrier layer in order to avoid subsequent fluorine attack on silicon. The Ti/TiN layers may, for example, be applied by sputtering.

Nowadays, in some cases expensive MOCVD TiN processes or CVD Ti/TiN processes are already being used. By way of example, selective CVD-Ti (precursor TiCl4, TiBr or TiI) is used so that it is deposited only at the bottom of the contact hole. The deposition takes place at high temperatures of over 500° C., so that TiSi forms immediately. This is followed by the CVD TiN deposition, which is likewise carried out at temperatures of over 500° C. and fills the contact hole (same Ti-containing precursor+nitrogen-containing gas). One drawback of this method consists in the fact that the formation of silicide during the CVD-Ti deposition is very difficult to control, with the result that the contact resistances have a greater scatter.

What are known as ultra-shallow junctions can no longer be produced in this way. In addition, the CVD Ti process is very expensive. In the known process, after the liner has been deposited, tungsten is deposited by means of CVD (precursor $WF_6$). This deposition once again comprises two steps, namely a first step, in which a nucleation layer is deposited, and a second step, which represents the actual bulk layer deposition.

Finally, a two-stage CMP (CMP=Chemical Mechanical Polishing) process is used to remove firstly the excess tungsten and then the barrier comprising Ti/TiN on the top side of the wafer. To further reduce costs, in particular the DRAM process has combined the filling of contact holes with the production of a first metal wiring in the form of a dual damascene process. However, tungsten has a very high bulk resistance, which leads to power losses in the corresponding circuits.

By optimizing the layer thicknesses, temperatures, pressures, deposition powers and gas compositions, it has been possible to use the abovementioned multilayer systems Ti/TiN/W (nucleation)/W (bulk) in semiconductor circuits for technologies as advanced as 170 nm. However, technologies of smaller than 140 nm require simplified process sequences and optimized layer systems.

Hitherto, a particular problem has been that of planarizing the titanium by means of the CMP process after it has been deposited, specifically in conjunction with tungsten, since, as has been stated, in a two-stage process first of all the tungsten has to be polished with chemical assistance, and then the Ti/TiN has to be polished predominantly by mechanical means.

SUMMARY OF THE INVENTION

Therefore, it is an object of the present invention to provide a contact for an integrated circuit, and a corresponding fabrication method, which can be fabricated in a more simple way.

According to the invention, this object is achieved by the contact for an integrated circuit and the corresponding fabrication method.

The idea on which the present invention is based consists in dispensing altogether with the deposition of tungsten and filling the contact hole entirely with Ti and/or TiN. In this way, it is possible to achieve even lower contact resistances than with tungsten, since the resistivity of Ti and of TiN are below that of tungsten.

In principle, it should also be possible to fill dual damascene structures. Hitherto, there has been a problem with planarizing Ti by means of the two-stage CMP process after it has been deposited; in the second step, the TiN no longer presents a problem, since it can successfully be polished at a high rate and with a high uniformity. The polishing of Ti in the second stage is slightly more difficult, since it can only be removed by mechanical means.

The problem of polishing tungsten and titanium in a CMP process is solved, according to the invention, by the contact hole being completely filled with titanium and/or TiN and then a corresponding annealing step being carried out, in which TiSi is formed at the bottom in contact with the silicon, and at the top side virtually all the titanium is converted into titanium nitride. The large-area titanium nitride at the wafer surface then allows a simplified, single-stage CMP process step to be carried out.

The contact hole does not have to be completely filled with titanium, but rather it is also possible for a void to remain in the interior of the contact hole, but the contact hole must be closed off at the top sufficiently for it not to be opened up during the CMP step, which would cause it to be filled with CMP slurry and/or water. Furthermore, it would tend to be advantageous if, as a result of the nitriding process, subsequently the entire surface or alternatively just parts of the titanium contact consisted of titanium nitride. The titanium nitride would act as a natural passivation preventing oxidation, even if this may be at the expense of an increase in the resistance.

The PVD process or the CVD process can be used as the process for filling the contact hole. It is also conceivable in future to use ALD (Atomic Layer Deposition) processes. In particular, it would be possible for a multistage process to include firstly a PVD titanium deposition and then a CVD titanium deposition or an ALD titanium deposition.

The subclaims give advantageous refinements and improvements to the corresponding subject matter of the invention.

According to a preferred refinement, the contact has a Ti layer, which runs at the wall and/or at the base of the contact hole, and a TiN filling.

According to a further preferred refinement, the contact is completely filled with Ti.

According to a further preferred refinement, the contact has a Ti starter layer, which runs at the wall and/or at the base of the contact hole, below the Ti filling.

According to a further preferred refinement, the contact has a Ti filling, on the top side of which a TiN layer is provided.

According to a further preferred refinement, the first line plane is a silicon plane, the contact having a TiSi layer on its underside.

BRIEF DESCRIPTION OF THE DRAWINGS

Exemplary embodiments of the invention are illustrated in the drawings and explained in more detail in the description which follows. In the drawings.

DETAILED DESCRIPTION OF THE INVENTION

Figure 1A:
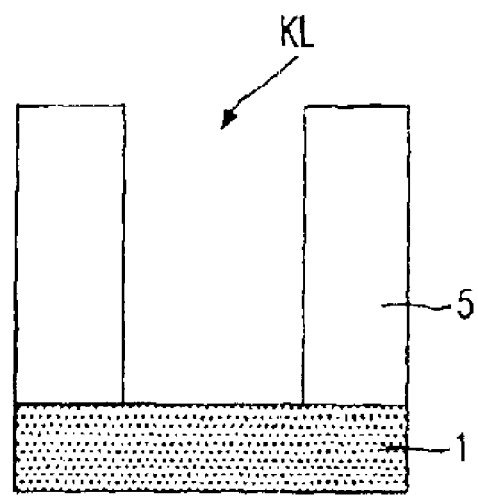
FIGS. 1i a–1d diagrammatically depict the essential method steps involved in the fabrication of a contact for an integrated circuit producing using silicon technology as a first embodiment of the present invention.

In the figures, identical reference symbols denote identical or functionally equivalent components.

FIGS. 1a–d show diagrammatic illustrations of the essential method steps involved in the fabrication of a contact for an integrated circuit produced using silicon technology as a first embodiment of the present invention.

In FIG. 1, reference numeral 1 denotes a silicon substrate having an integrated circuit (not shown) and 5 denotes an insulation layer above it, in the form of a layer of oxide, in which a contact hole Kl, in which the contact is to be formed, has been formed by means of a standard photolithographic etching process.

Figure 1B:
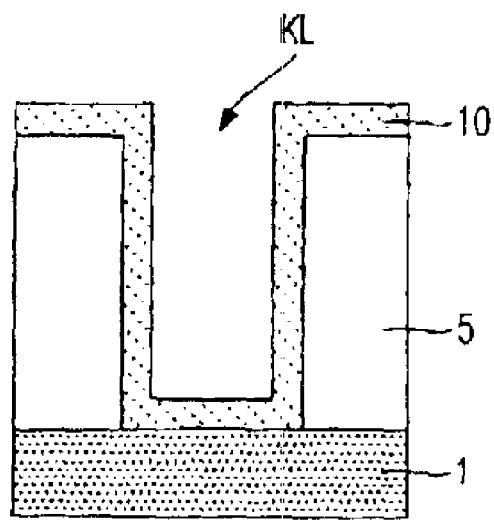
Figure 1C:
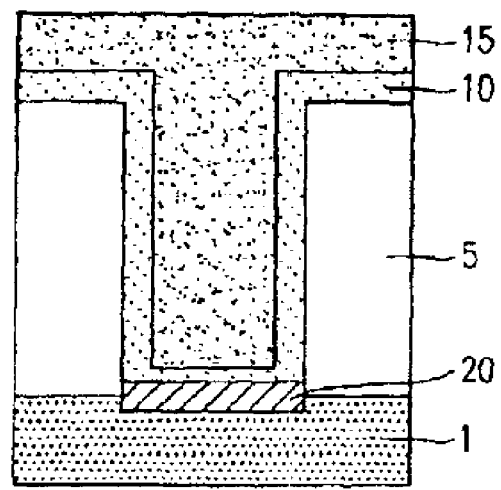

As shown in FIG. 1b, after the standard contact-hole cleaning, PVD-Ti is then deposited over the entire surface in order to form a Ti layer 10.

Then, in a further process step, CVD-TiN deposition takes place in situ at 600° C. using a precursor $TiCl_4$, filling the contact hole Kl with a TiN layer 15, the layer thickness being, for example 100 nm to 150 nm, without any voids remaining in the contact hole in this example. During the deposition of TiN at 600° C., in-situ annealing takes place, in which a TiSi layer 20 forms in the lower region of the contact.

Figure 1D:
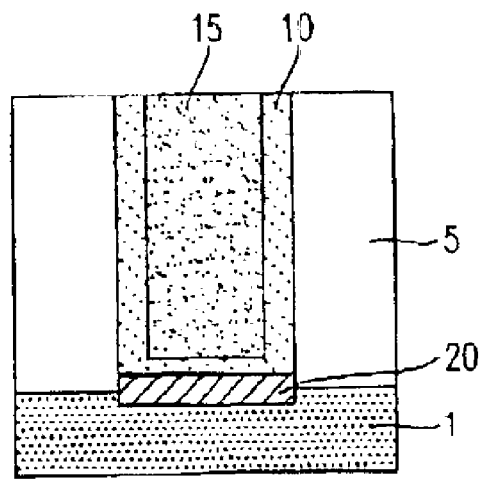

Then, referring now to FIG. 1d, a single-stage CMP step is carried out in order to remove the excess Ti/TiN from the surface of the insulation layer 5, resulting in the process state shown in FIG. 1d being reached, in which the contact metal is only present in the contact hole. Following this process step, a PVD-aluminum deposition may be provided as usual, followed by the standard patterning of this aluminum metallization plane.

In this embodiment, a liner anneal is no longer required, and furthermore a CVD tungsten deposition is also no longer required, and therefore all that is then required is a single-stage CMP step for planarization. The formation of TiSi and therefore the formation of contact resistance above the PVD/Ti layer takes place as in the process which has hitherto been customary.

A process variant of this embodiment could involve the TiN deposition being carried out by means of an MOCVD process at 380° C. (precursor TDMAT or TDEAT), although in this case in-situ annealing is not possible, on account of the lower temperature. Possible layer thicknesses with this process are likewise 100 nm to 150 nm in order to fill the contact hole Kl without voids.

In this variant, a separate annealing step would be carried out at typically 580° C. following the MOCVD-TiN deposition. The further process sequence corresponds to that which has been explained above with reference to FIGS. 1a to 1d.

A further process variant could consist in the liner annealing step being carried out at typically 580° C. prior to the MOCVD-Ti deposition at 380° C.

Yet another variant could consist in the annealing step being eliminated altogether and the MOCVD-TiN deposition being carried out at 380° C. This variant could be employed, for example, if the contact is fabricated not between a silicon plane and a metal plane, but rather between two metal planes.

FIGS. 2a–d show diagrammatic illustrations of the essential method steps involved in the fabrication of a contact for an integrated circuit produced using silicon technology as a second embodiment of the present invention.

Figure 2A:
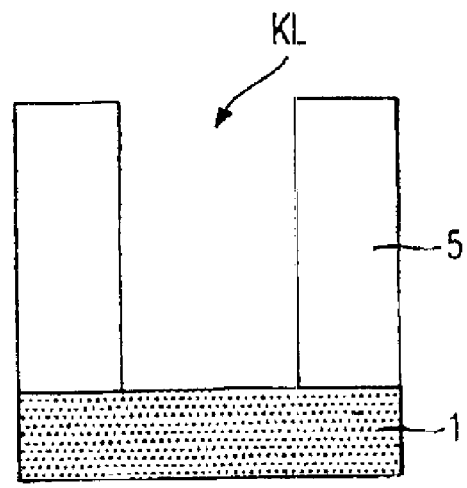
FIGS. 2a–2d diagrammatically depict the essential method steps involved in the fabrication of a contact for an integrated circuit produced using silicon technology as a second embodiment of the present invention.

In the exemplary embodiment shown in FIG. 2 the process state shown in FIG. 2a corresponds to that shown in FIG. 1a, which has already been explained above.

Figure 2B:
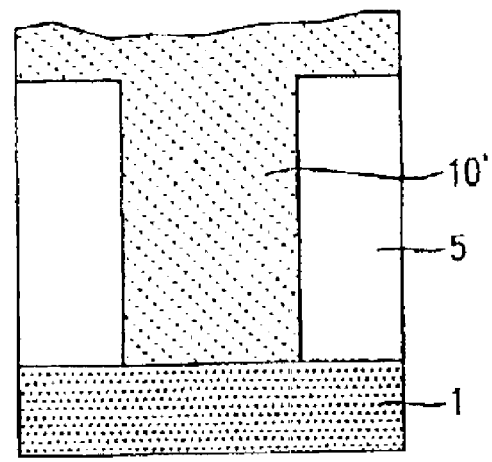

Then, in a further process step, which is explained with reference to FIG. 2b, first of all PVD-Ti deposition takes place in order to completely fill the contact hole Kl with a Ti layer 10'.

Figure 2C:
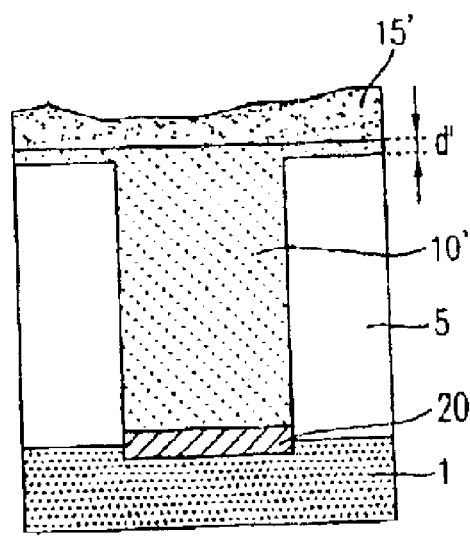
Figure 2D:
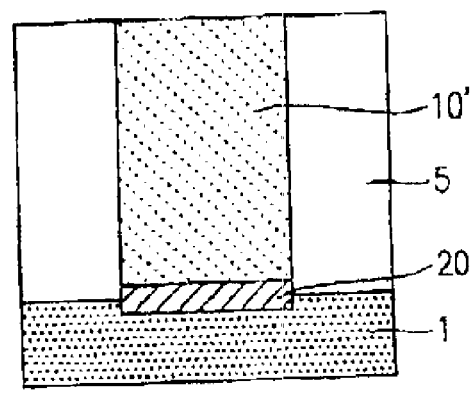
Figure 3:
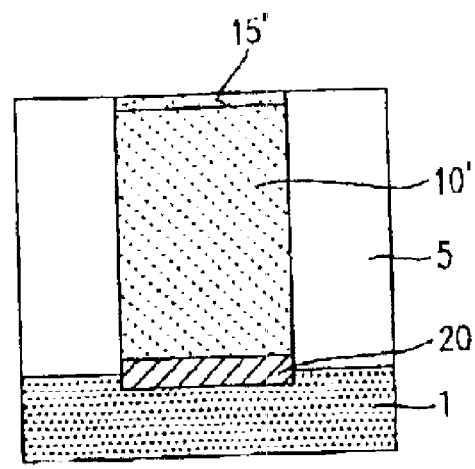
FIG. 3 shows a contact in accordance with a third embodiment of the present invention.

This is followed, with reference to FIG. 2c, by an annealing step at typically 580° C., in which on the one hand the TiSi layer 20 forms at the bottom of the contact and on the other hand part of the Ti layer 10' which lies at the surface is converted into a TiN layer 15'. The proportion of the Ti layer 10 which is converted into the TiN layer 15' in this exemplary embodiment is such that a small residual thickness d' of the titanium layer 10' still remains in place on the surface. However, it is also conceivable for all the Ti lying at the surface to be converted into TiN, or even for an upper part of the contact-hole filling also to be converted into TiN. The latter variant would have the advantage that TiN could act as an oxidation barrier for subsequent process steps. A third embodiment of this type is shown in FIG. 3.

Although the present invention has been described above on the basis of a preferred exemplary embodiment, it is not restricted to this embodiment, but rather can be modified in numerous ways.

In particular, the explanation given in connection with integrated circuits produced using silicon technology is merely an example.

LIST OF REFERENCE SYMBOLS

1 Si substrate
5 SiO$_2$ insulation layer
10, 10' Ti layer
15, 15' TiN layer
20 TiSi layer
KL Contact hole
d' Remaining thickness of the Ti layer 10'

What is claimed is:

1. Method for fabricating a contact comprising the steps of:

(a) depositing a Ti layer in order to completely fill a contact hole end on a surrounding surface of an insulation layer;

(b) partially converting the Ti layer into a TiN layer in such a manner that a TiN layer is provided on the top side in the contact hole; and (c) polishing back the Ti layer and any remaining TiN layer on the surrounding surface of the insulation layer in a single-stage polishing step.

2. Method according to claim 1, wherein an annealing step is carried out in order to produce a TiSi layer on the underside of the contact.

* * * * *